US 011005155B2

United States Patent
Khan et al.

(10) Patent No.: US 11,005,155 B2
(45) Date of Patent: May 11, 2021

(54) MICROWAVE ANTENNA APPARATUS AND PACKAGE

(71) Applicant: Sony Corporation, Tokyo (JP)

(72) Inventors: Wasif Tanveer Khan, Stuttgart (DE); Mudassar Nauman, Stuttgart (DE); Arndt Thomas Ott, Stuttgart (DE); Ramona Hotopan, Stuttgart (DE)

(73) Assignee: SONY CORPORATION, Tokyo (JP)

( * ) Notice: Subject to any disclaimer, the term of this patent is extended or adjusted under 35 U.S.C. 154(b) by 144 days.

(21) Appl. No.: 16/289,680

(22) Filed: Mar. 1, 2019

(65) Prior Publication Data
US 2019/0280368 A1    Sep. 12, 2019

(30) Foreign Application Priority Data
Mar. 8, 2018    (EP) .................... 18160733

(51) Int. Cl.
*H01Q 1/22*    (2006.01)
*H01L 23/00*    (2006.01)
(Continued)

(52) U.S. Cl.
CPC ....... *H01Q 1/2283* (2013.01); *H01L 23/3128* (2013.01); *H01L 23/49816* (2013.01);
(Continued)

(58) Field of Classification Search
CPC .... H01Q 1/2283; H01Q 1/48; H01Q 21/0093; H01L 24/24; H01L 23/66; H01L 23/49838; H01L 23/49822; H01L 23/49827; H01L 23/49816; H01L 23/3128; H01L 24/25; H01L 2924/19032; H01L 2223/6616; H01L 2223/6627; H01L 2223/6677; H01L 2224/24265; H01L 2224/24225; H01L 2224/2518; H01L 2924/1423; H01L 2223/6683; H01L 2224/12105; H01L 2224/04105; H01L 2224/24195;
(Continued)

(56) References Cited

U.S. PATENT DOCUMENTS 8,174,451 B2    5/2012    Rofougaran
8,278,749 B2    10/2012   Lachner et al.
(Continued)

FOREIGN PATENT DOCUMENTS

WO    2016/092084 A1    6/2016

OTHER PUBLICATIONS

Fischer et al., "77-GHz Multi-Channel Radar Transceiver With Antenna in Package", IEEE transactions on antennas and propagation, vol. 62, No. 3, Mar. 2014, pp. 1386-1394.
(Continued)

*Primary Examiner* — Renan Luque
(74) *Attorney, Agent, or Firm* — Xsensus LLP

(57) ABSTRACT

A microwave antenna apparatus comprises a semiconductor package module comprising a mold layer, a semiconductor element, a coupling element and a redistribution layer, and an antenna module mounted on top of the semiconductor package module, said antenna module comprising an antenna substrate, one or more antenna elements, an antenna feed layer and an antenna ground layer. The footprint of the antenna module is larger than the footprint of the semiconductor package module.

14 Claims, 6 Drawing Sheets

(51) Int. Cl.
*H01L 23/66* (2006.01)
*H01L 23/498* (2006.01)
*H01L 23/31* (2006.01)
*H01Q 1/48* (2006.01)
*H05K 1/18* (2006.01)
*H05K 1/02* (2006.01)

(52) U.S. Cl.
CPC .. *H01L 23/49822* (2013.01); *H01L 23/49827* (2013.01); *H01L 23/49838* (2013.01); *H01L 23/66* (2013.01); *H01L 24/24* (2013.01); *H01L 24/25* (2013.01); *H01Q 1/48* (2013.01); H01L 2223/6616 (2013.01); H01L 2223/6627 (2013.01); H01L 2223/6677 (2013.01); H01L 2223/6683 (2013.01); H01L 2224/24225 (2013.01); H01L 2224/24265 (2013.01); H01L 2224/2518 (2013.01); H01L 2924/1423 (2013.01); H01L 2924/19032 (2013.01); *H05K 1/0243* (2013.01); *H05K 1/181* (2013.01); H05K 2201/10378 (2013.01); H05K 2201/10734 (2013.01)

(58) Field of Classification Search
CPC .... H01L 2224/16227; H01L 23/49833; H05K 1/181; H05K 2201/10378; H05K 2201/10734; H05K 1/0243; H05K 2201/10098; H05K 3/3436
See application file for complete search history.

(56) References Cited

U.S. PATENT DOCUMENTS

| | | | | |
|---|---|---|---|---|
| 9,935,065 | B1* | 4/2018 | Baheti | H01L 23/49822 |
| 2009/0168367 | A1* | 7/2009 | Fujii | H01L 23/3128 |
| | | | | 361/720 |
| 2013/0321234 | A1* | 12/2013 | Lin | H01Q 21/28 |
| | | | | 343/848 |
| 2014/0008785 | A1 | 1/2014 | Lin et al. | |
| 2014/0293529 | A1 | 10/2014 | Nair et al. | |
| 2015/0061924 | A1 | 3/2015 | Binzer et al. | |
| 2015/0084194 | A1* | 3/2015 | Molzer | H01L 23/481 |
| | | | | 257/741 |
| 2015/0097633 | A1* | 4/2015 | DeVries | H01P 3/003 |
| | | | | 333/33 |
| 2015/0380343 | A1* | 12/2015 | Koontz | H01L 23/562 |
| | | | | 257/621 |
| 2016/0056544 | A1* | 2/2016 | Garcia | H01Q 1/38 |
| | | | | 343/725 |
| 2016/0240492 | A1* | 8/2016 | Wolter | H01Q 1/526 |
| 2019/0206833 | A1* | 7/2019 | Meyer | H01L 24/19 |

OTHER PUBLICATIONS

Hamidipour et al., "160-GHz SiGe-Based Transmitter and Receiver With Highly Directional Antennas in Package", Proceedings of the 8th European Microwave Integrated Circuits Conference, Oct. 6-8, 2013, Nuremberg, Germany, pp. 81-84.
Fischer et al., "A 77-GHz Antenna in Package", Proceedings of the 8th European Radar Conference, Oct. 12-14, 2011, Manchester, UK, pp. 428-431.
Seler et al., "3D Rectangular Waveguide Integrated in embedded Wafer Level Ball Grid Array (eWLB) Package", 2014 Electronic Components & Technology Conference, pp. 956-962.
Hamidipour et al., "A Rhombic Antenna Array Solution in eWLB Package for Millimeter-Wave Applications", Proceedings of the 42nd European Microwave Conference, Oct. 29-Nov. 1, 2012, Amsterdam, The Netherlands, pp. 205-208.
Pourmousavi et al., "Antenna Design and Characterization for a 61 GHz Transceiver in eWLB Package", Proceedings of the 43rd European Microwave Conference, Oct. 7-10, 2013, Nuremberg, Germany, pp. 1415-1418.
Hamidipour et al., "Antennas in Package With Stacked Metallization", Proceedings of the 43rd European Microwave Conference, Oct. 7-10, 2013, Nuremberg, Germany, pp. 56-59.
Seler et al., "Chip-to-Rectangular Waveguide Transition Realized in embedded Wafer Level Ball Grid Array (eWLB) Package", IEEE, 2014, 4 pages.
Wojnowski et al., "Embedded Wafer Level Ball Grid Array (eWLB) Technology for Millimeter-Wave Applications", 13th Electronics Packaging Technology Conference, 2011, pp. 423-429.
Henawy et al., "Integrated Antennas in eWLB Packages for 77 GHz and 79 GHz Automotive Radar Sensors", Proceedings of the 41st European Microwave Conference, Oct. 10-13, 2011, Manchester, UK, pp. 1312-1315.
Tong et al., "Wideband Differential Antenna in Package with Superstrate Structure at 77GHz", IEEE Asia-Pacific Conference on Antennas and Propagation, Aug. 27-29, 2012, Singapore, 4 pages.

* cited by examiner

MICROWAVE ANTENNA APPARATUS AND PACKAGE

CROSS-REFERENCE TO RELATED APPLICATION

The present application claims priority to EP 18160733.4, filed Mar. 8, 2018, the entire contents of which are incorporated herein by reference.

BACKGROUND

Field of the Disclosure

The present disclosure relates to a microwave antenna apparatus and a microwave antenna package.

Description of Related Art

Fan-out wafer level packaging technology such as the embedded wafer-level ball grid array (eWLB) has matured for microwave and mm-wave radar and communication systems over the past years. This packaging technology is the first choice for low-cost system integration of MMICs, passives, and antennas into a single plastic type package. Many different types of planar antenna structures have been published, e.g. in M. Wojnowski et al., "Embedded Wafer Level Ball Grid Array (eWLB) Technology for Millimeter-Wave Applications," Proc. IEEE 13th Electronics Packaging Technology Conference (EPTC2011), Singapore, pp. 423-429, December 2011. They all have in common, that the antenna elements are printed on one or more redistribution layers (RDLs). The disadvantage of the aforementioned solutions are their narrow operating bandwidth (1-5%), distorted radiation patterns due to thick mold compound in the radiating direction, and the high amount of parasitic radiation to all directions. Further, these planar antenna structures cannot provide enough gain for the long range and medium range radar applications without an additional apparatus. E. Seler et al., "3D rectangular waveguide integrated in embedded Wafer Level Ball Grid Array (eWLB) package", Electronic Components and Technology Conference (ECTC), 2014 IEEE 64th, pp. 956-962, 27-30 May 2014 discloses a 3D rectangular waveguide in the fan-out area of an eWLB package using laminate inserts. To obtain the waveguide side walls in eWLB, an RF laminate with micro-vias is inserted in the fan-out area. The classical redistribution layer (RDL) on the one surface and an additional back side metallization on the other surface of the package are used to realize the top and bottom walls of the waveguide. In this paper, two different transition designs from redistribution layer to the SIW-type transmission lines are investigated in the package level. However, the antenna design is not emphasized. These SIW-type transmission lines are realized using RF laminates which are costly.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a microwave antenna apparatus and a microwave antenna package, which overcome existing limitations in terms of areas, control of the antenna beam width, gain and type of antennas affecting the radiation patterns of the antennas.

According to an aspect there is provided microwave antenna apparatus comprising
  a semiconductor package module comprising a mold layer, a semiconductor element, a coupling element and a redistribution layer, and
  an antenna module mounted on top of the semiconductor package module, said antenna module comprising an antenna substrate, one or more antenna elements, an antenna feed layer and an antenna ground layer, wherein the footprint of the antenna module is larger than the footprint of the semiconductor package module.

According to a further aspect there is provided a microwave antenna package
  a PCB arrangement comprising a PCB layer and
  a microwave antenna apparatus as defined in claim 1 coupled to the PCB arrangement forming a fan-out wafer level package.

Embodiments are defined in the dependent claims. It shall be understood that the disclosed microwave antenna package has similar and/or identical further embodiments as the claimed microwave antenna apparatus and as defined in the dependent claims and/or disclosed herein.

One of the aspects of the disclosure is to provide a novel heterogeneous integration of an antenna module, e.g. different multi-layer antenna structures, which can be placed on top of a semiconductor package module, e.g. an eWLB package, wherein one or more coupling elements (coupling blocks) are embedded in the semiconductor package module. The antenna module has a larger size (i.e. footprint) than the semiconductor package module. The antennas may be fed by means of a through package via or a coupling block. The coupling block may have different transmission lines or vias to couple the signals through magnetic or electromagnetic coupling. These modules and blocks can be fabricated separated as a separation PCB or ceramic substrate manufacturing process and then integrated with the semiconductor package module using a pick and place process.

The disclosed package on package (PoP) antenna concept opens up the opportunity for the different types of antennas that were not possible because of the eWLB package size limitations, non-desired results caused by epoxy and reflector on the PCB, etc. in the known solutions.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWING

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

All package substrates and mold compounds in known microwave antenna apparatus and packages are made through an integrated process where the same material is used as a mold compound or package substrate. There is no heterogeneous integration of coupling blocks and antenna modules. Moreover, only through package vias are used as coupling signals from chip to antenna. In contrast, according to the present disclosure the antenna module is separately fabricated on any substrate (organic or ceramic) and can be placed by a pick and placer. The antennas are fed by means of a through package via or a coupling block separately fabricated on a same of different substrate (ceramic or organic) and embedded in a mold compound using a pick and placer. The coupling block may have different transmission lines or vias to couple the signals through magnetic or electromagnetic coupling.

One of the ideas is to couple the RF signal from chip embedded into eWLB mold compound through separately fabricated and embedded coupling block to an antenna externally and separately placed on top of the eWLB package. The PoP antenna module may be of any substrate material and has a larger size than the size of the eWLB package. This allows us integrating different types of antennas separately fabricated and integrated to solve the limitation of an integrated process. The choice of antenna ground can play a critical role in making the complete system integration complex or simple.

Figure 1:
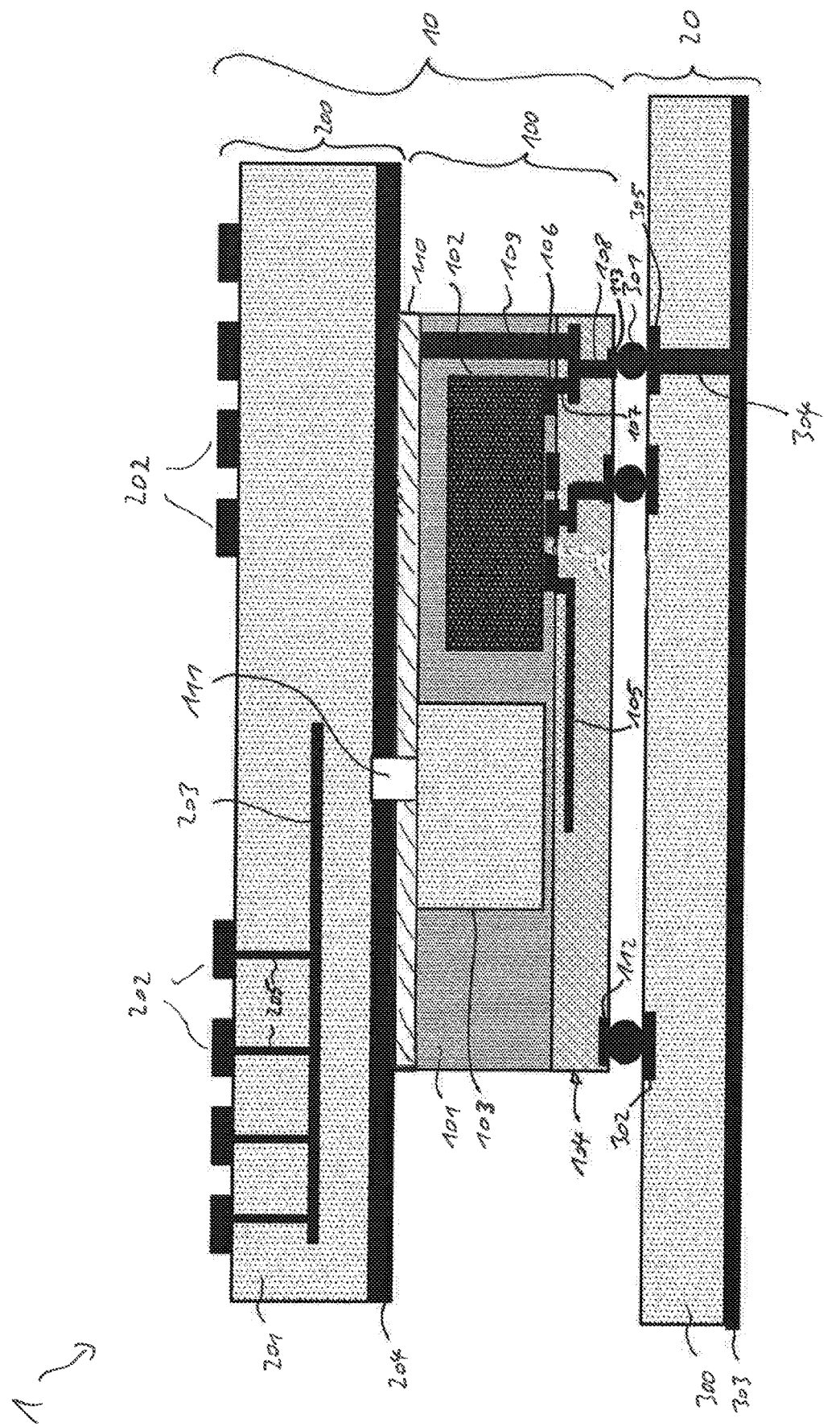
FIG. 1 shows a microwave antenna package including a first embodiment of a microwave antenna apparatus according to the present disclosure.

The present disclosure presents a complete integration of antenna coupling blocks, antenna modules and the interconnection of RFIC chip, antenna and PCB grounds. FIG. 1 shows a microwave antenna package 1 including a first embodiment of a microwave antenna apparatus 10 according to the present disclosure, which is placed on a PCB (printed circuit board) arrangement 20. The microwave antenna apparatus 10 comprises a semiconductor package module 100 and an antenna module 200. The semiconductor package module 100 comprises a mold layer 101, a semiconductor element 102, a coupling element 103 and a redistribution layer (RDL) 104. The antenna module 200 is mounted on top of the semiconductor package module 100. It comprises an antenna substrate 201, one or more antenna elements 202 (e.g. forming an antenna array), an antenna feed layer 203 and an antenna ground layer 204 (also called antenna ground plane). According to the present disclosure the footprint of the antenna module 200, i.e. the size of the area of the antenna module 200, is larger than the footprint of the semiconductor package module 100.

In this embodiment the RF signal is thus coupled from the chip 102 to the antenna elements 202 via the microstrip through the coupling element 103 (also called coupling block). A microstrip 105 in the RDL layer 104 shares the antenna ground plane 204, i.e. the ground layer 303 on the bottom of the PCB arrangement 20 below the microstrip 105 is not used as ground plane for the microstrip 105, but the antenna ground plane 204 above the microstrip 105. For this purpose, the ground layer 303 may have a cut-out below the microstrip 105. In another embodiment the microstrip 105 may be configured as a stripline-type transmission line that is sandwiched between two ground planes.

The chip ground 106 is connected to a PCB layer 300 of the PCB arrangement 20 and antenna grounds 204 through vias 107, 108, 109 shown in the FIG. 1. The via fed antenna eases out the integration of the large arrays which may require the extension of PoP antenna module 200 extending beyond the eWLB package, i.e. the semiconductor package module 100. The ground 110 on epoxy, i.e. the ground layer 110 on top of the mold layer 101, allows the easy interconnection with the chip ground 106 using through epoxy vias 107, 108, 109 (as shown in FIG. 1) or through coupling block vias (shown e.g. in FIG. 4).

In this embodiment aperture coupling is thus applied, according to which the RF signal of the chip 102 is coupled from the microstrip 105 through the coupling element 103 and an aperture (gap) 111 in the ground layers 110 and 204 into the antenna feed layer 203, from which the RF signal is provided to the antenna elements 202 by antenna feed vias 205.

The ground 204 on the bottom most layer of the antenna module 200 allows extending the antenna module 200 beyond the eWLB package 100. Both grounds 204, 110 may be connected together through conductive epoxy. The conductive epoxy and the through mold vias 107, 108, 109 are part of the standard manufacturing process. The antenna module 200 can be placed on eWLB package 100 using a pick and place machine, e.g. using some fiducial marks.

The microwave antenna apparatus 10 is placed on the PCB arrangement 20 comprising a PCB layer 300 to form a fan-out wafer level package, in particular an embedded wafer-level ball grid array (eWLB). This process may be performed by the manufacturer or the end user. In this process solder balls 301 are placed on the outer surface of the under bump metallization layer 112. Thereafter, the microwave antenna apparatus 10 is soldered onto the PCB arrangement 20 which has strip lines 302 on the PCB layer 300 corresponding to the under bump metallization layer (UBM) 112 and the solder balls 302, thus arriving at the final microwave antenna package 1. The PCB arrangement 20 further comprises a ground layer 303 (ground plane) and a PCB via 304 for connecting the ground layer 303 via a strip line 305 with a strip line 113 that is connected to the chip ground 106.

Figure 2:
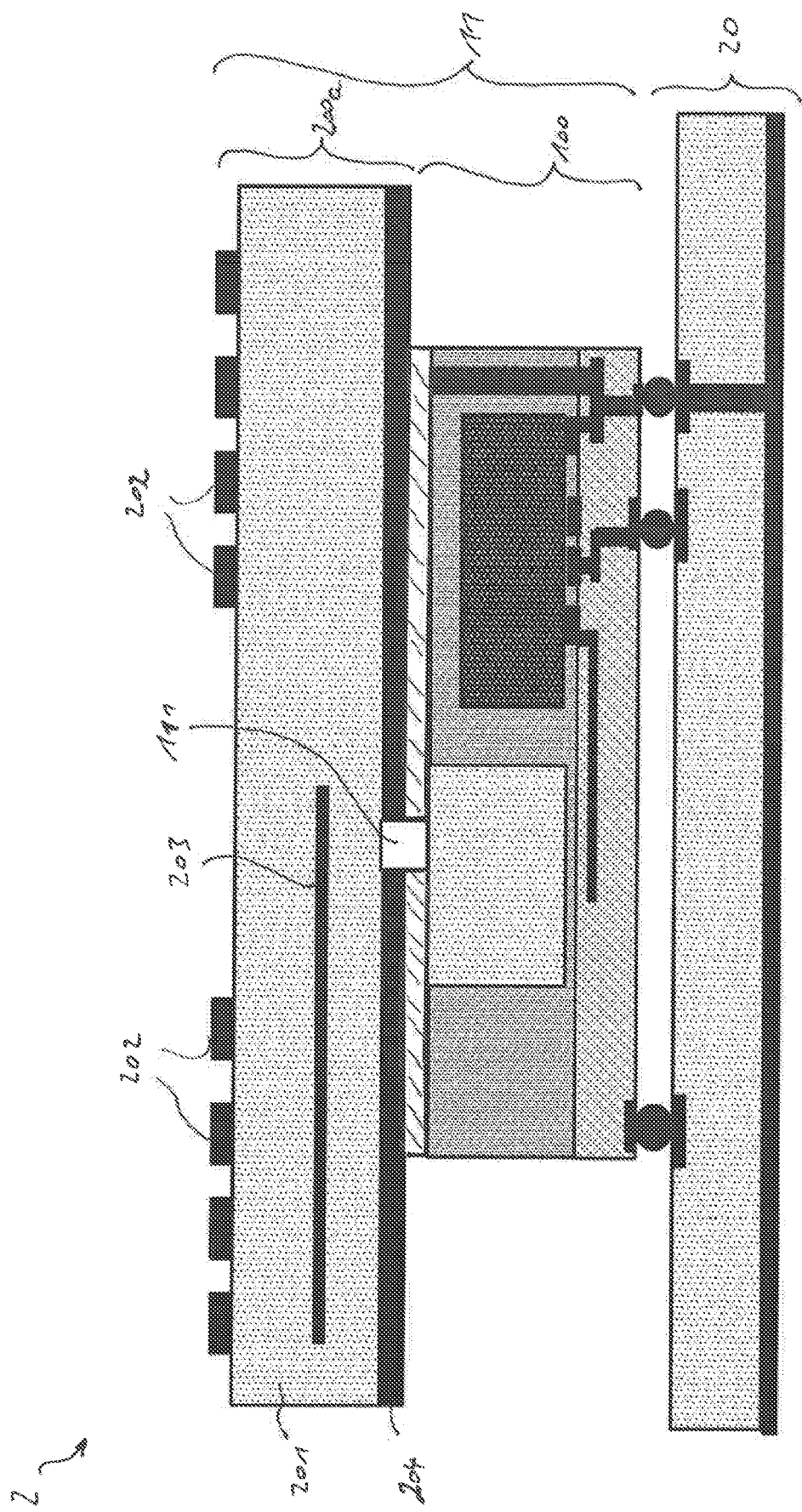
FIG. 2 shows a microwave antenna package including a second embodiment of a microwave antenna apparatus according to the present disclosure.

Another possibility is to use a proximity coupled antenna as depicted in FIG. 2. FIG. 2 shows a microwave antenna package 2 including a second embodiment of a microwave antenna apparatus 11 according to the present disclosure. The antenna apparatus 11 comprises a slightly modified antenna module 200a and the semiconductor package module 100. In this embodiment the coupling of the RF signal from the chip 102 to the feed network 203 on the antenna module 200a is again performed through aperture coupling. The antenna feed network 203 is, however, not connected to the antenna elements 202 by vias, as in the antenna module 200, but (wireless) proximity coupling is used for coupling the RF signal into the antenna elements.

Figure 3:
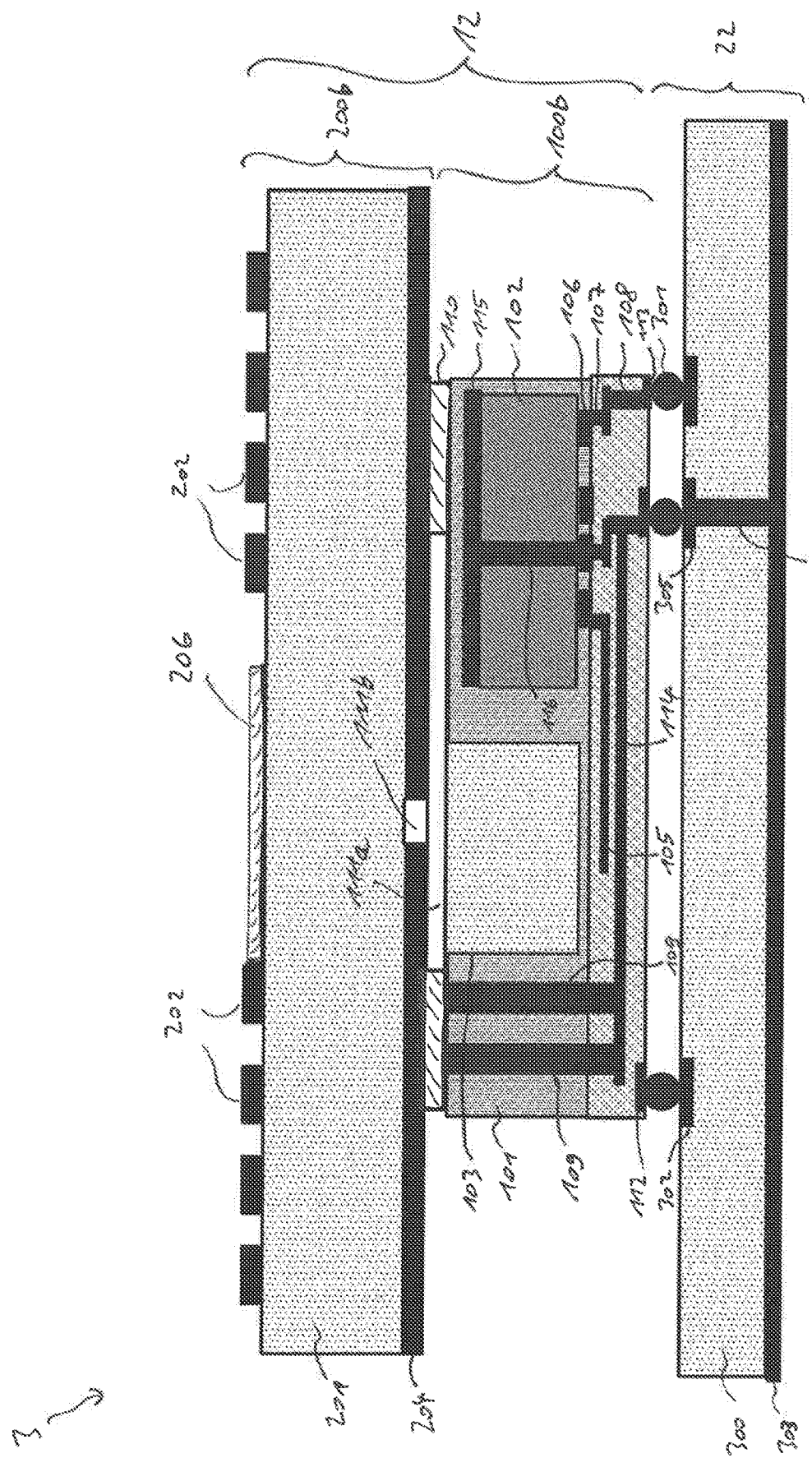
FIG. 3 shows a microwave antenna package including a third embodiment of a microwave antenna apparatus according to the present disclosure.

FIG. 3 shows a microwave antenna package 3 including a third embodiment of a microwave antenna apparatus 12 according to the present disclosure and a slightly modified PCB arrangement 22. The microwave antenna apparatus 12 comprises a modified antenna module 200b and a modified semiconductor package module 100b.

In this embodiment inset fed antennas are used, i.e. an insert feed layer 206 is arranged on top of the antenna substrate 201 between the antenna elements 202 to feed them. Aperture coupling is used to transfer the energy form RF chip 102 to the antenna feed network represented by the insert feed layer 206. In this embodiment the aperture 111a in the ground layer 110 on top of the mold layer 101 of the semiconductor package module 100b is larger than the aperture 111b in the ground layer 204 on the bottom of the antenna substrate 201, which generally requires less alignment of the apertures in both ground layers and thus makes the connection easier. Thus, in this embodiment another way to connect the ground 110 on epoxy and the bottom most layer (i.e. the ground plane 204) of the antenna module 200b is provided using connections at a selective section to ease out the aperture coupling. In the embodiments shown in FIGS. 1 and 2 there are slots in the ground for coupling, which are aligned, but it may be difficult to align both slots in the metallization layer 110 and the ground plane 204 forming the aperture 111. In the embodiment shown in FIG. 3, selective ground plane connections may be applied, whereas the slot is only provided in the ground plane 204, which eases out alignment of two slots in the ground. A similar modification could be applied in the embodiments shown in FIGS. 1 and 2.

Further, the microstrip line 105 (in the RDL layer 104) picking up the RF signals has a separate ground plane 114 in the RDL layer 104. The ground interconnections, in particular vias 107, 108, 109 through the mold layer 101 and the RDL layer 104, respectively, are also shown in FIG. 3. Still further, an additional chip ground layer 115 is provided on top of the semiconductor element 102 (generally as part of the semiconductor element 102), which is connected with the ground layer 106 on the bottom of the semiconductor element 102 by a semiconductor via 116. The configuration shown in FIGS. 1 and 2 requires the complete alignment of the aperture in two ground planes.

Aperture coupled patch antennas and dielectric antennas can also be used. For larger arrays and MIMO configuration, the antenna ground plane of the antenna module may be extended beyond the semiconductor package module to accommodate the aperture feeding. For this purpose, the antenna ground plane may be placed in one of the middle layers of the antenna module. This is possible but may further require ground connections through vias.

Figure 4:
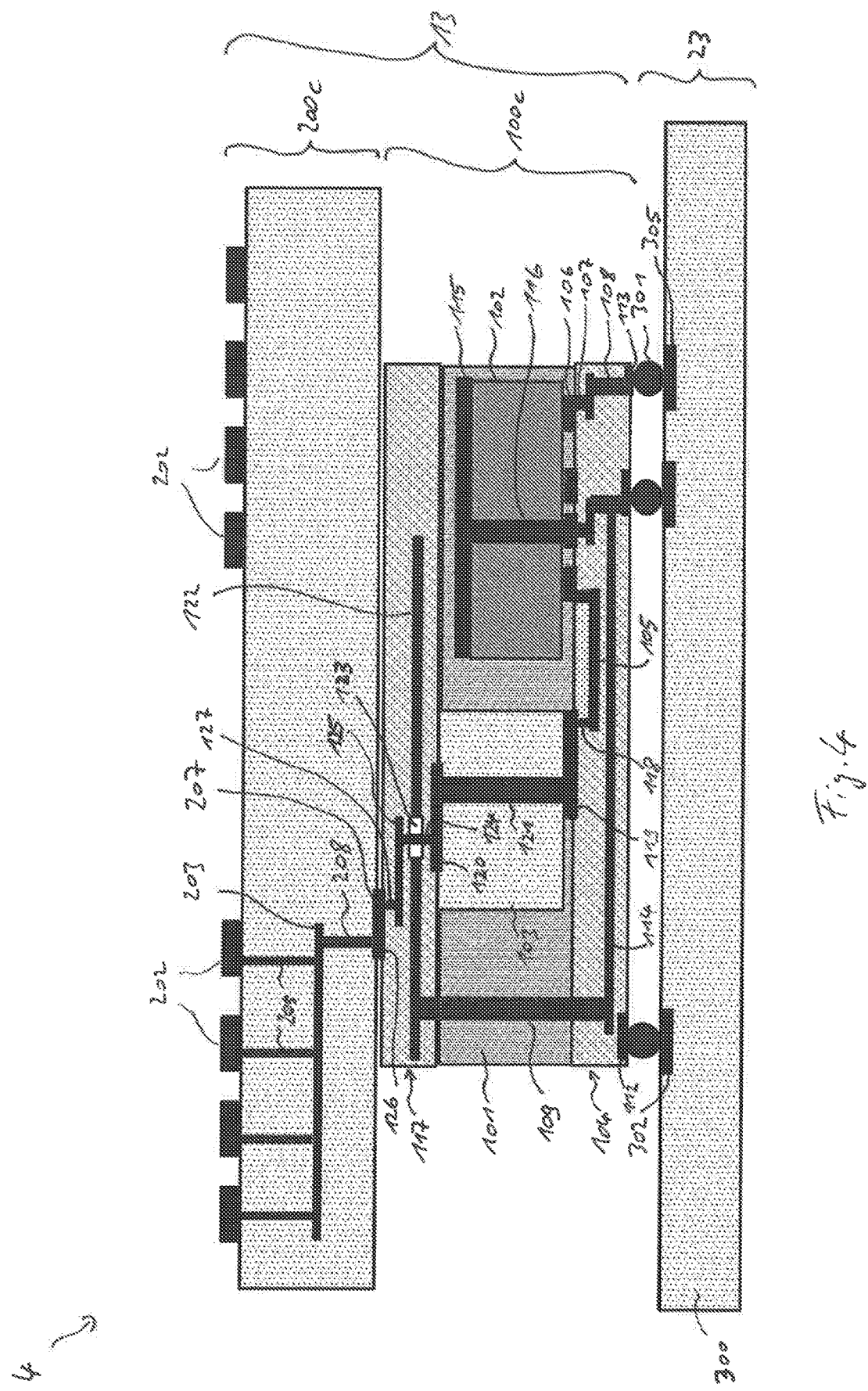
FIG. 4 shows a microwave antenna package including a fourth embodiment of a microwave antenna apparatus according to the present disclosure.

FIG. 4 shows a microwave antenna package 4 including a fourth embodiment of a microwave antenna apparatus 13 according to the present disclosure and a modified PCB arrangement 23. The microwave antenna apparatus 13 comprises a modified antenna module 200c and a modified semiconductor package module 100c.

Figure 6:
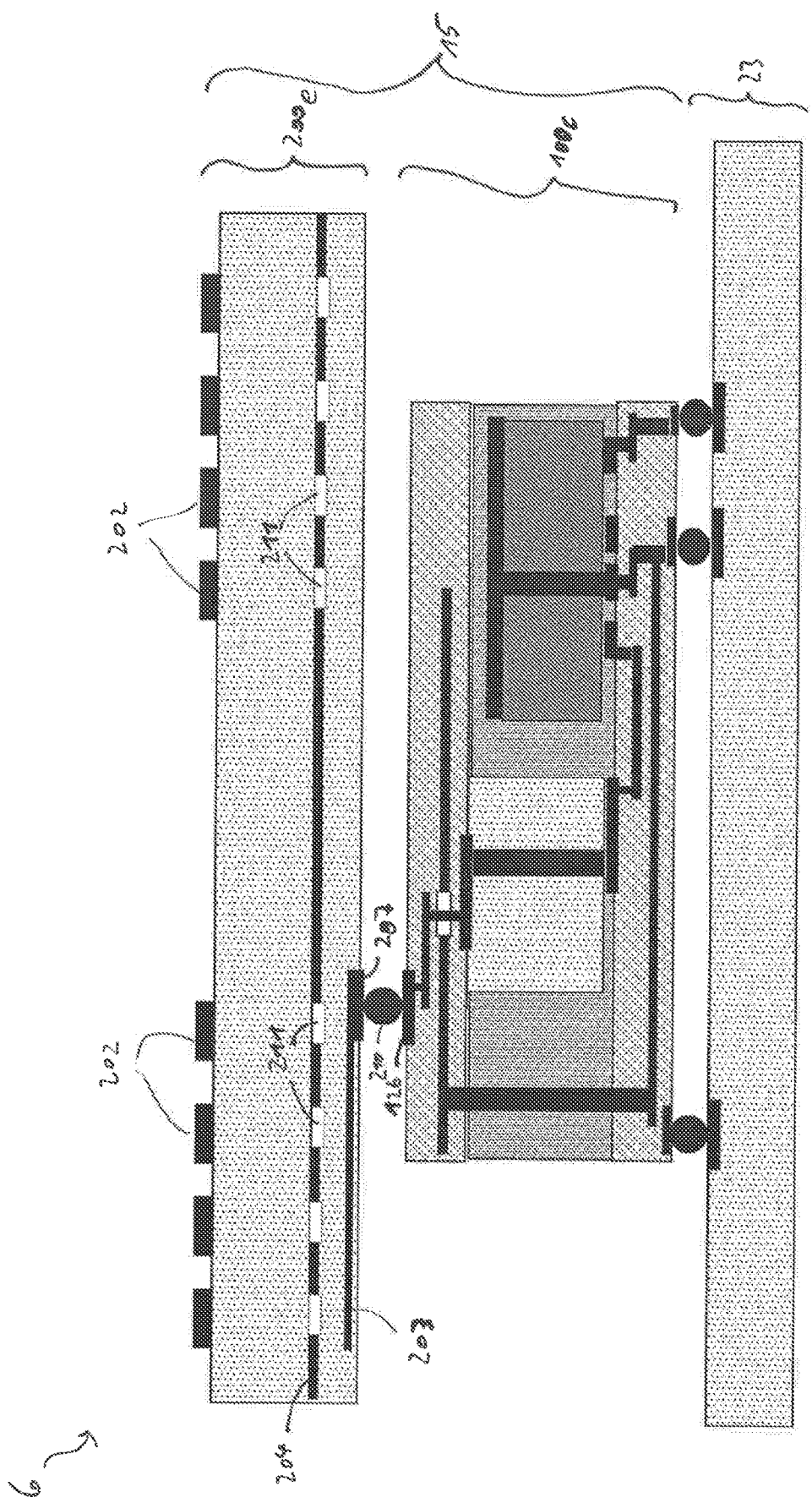
FIG. 6 shows a microwave antenna package including a sixth embodiment of a microwave antenna apparatus according to the present disclosure.

This embodiment uses another way for providing connections between the ground of the antenna module 200c and the ground of the semiconductor package module 100c. For this purpose, a second RDL layer 117 is provided on the top layer of the semiconductor package module 100c. Thus, in this embodiment separate RDL layers 104, 117 are arranged on two sides of the semiconductor package module 100c. Further, conductive epoxy (not shown) may be provided at the UBM layer for ground connections. The conductive epoxy provides a reliable connection between a coupling lines 126 and 207. This connection can be made using conductive epoxy or, alternatively, solder balls (as shown in FIG. 6). Such a connection is more reliable than just placing them on top of each other.

In the antenna module 200c the antenna feed layer 203 is connected to the antenna elements 202 by vias 205 and to a coupling line 207 provided on the bottom side by a via 208. Additionally, solder balls and an UBM layer may be provided there for the connection between the antenna module 200c and the semiconductor package module 100c for coupling of the RF signal.

In the semiconductor package module 100c the RF signal is coupled from the microstrip 105 in the lower RDL layer 104 through a via 118 in the RDL layer 104, metal layers 119, 120 on the bottom and the top of the coupling element 103 and a via 121 through the coupling element 102 to the upper RDL layer 117. In the upper RDL layer 117 a ground layer 122 is provided having an aperture 123, through which a via 124 leads to microstrip 125, which is connected to a coupling line 126 by a via 127. The coupling line 126 is preferably connected to the coupling line 207 by a solder ball (not shown) or in any other suitable way.

The PCB arrangement in this embodiment may be configured in the same way as in the other embodiments depicted in FIGS. 1-3, but may alternatively be configured as shown in FIG. 4. In this embodiment strip lines 302 and ground lines 305 are only provided on the top layer of the PCB layer 300.

Figure 5:
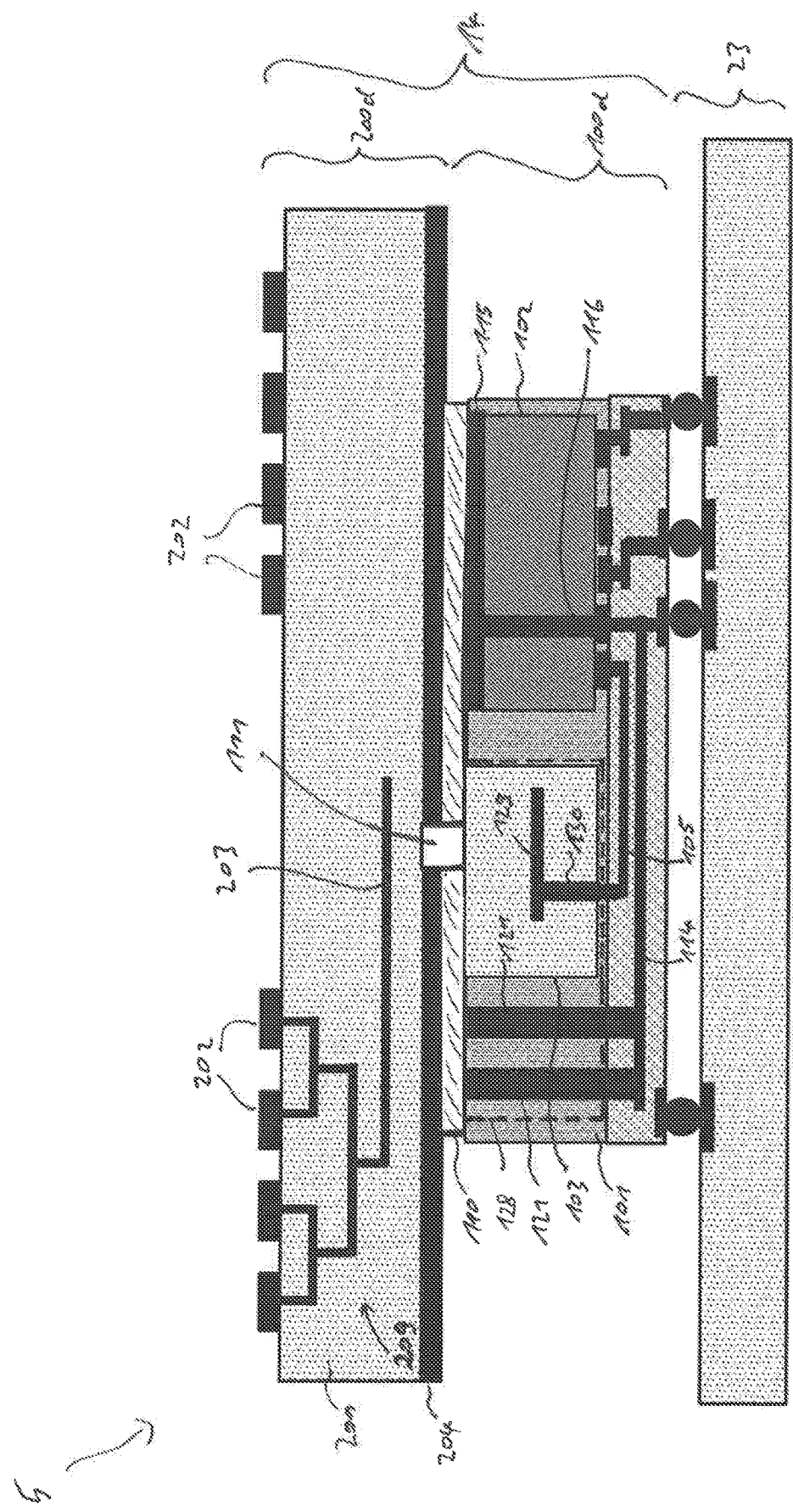
FIG. 5 shows a microwave antenna package including a fifth embodiment of a microwave antenna apparatus according to the present disclosure.

FIG. 5 shows a microwave antenna package 5 including a fifth embodiment of a microwave antenna apparatus 14 according to the present disclosure and a modified PCB arrangement 23. The microwave antenna apparatus 14 comprises a modified antenna module 200d and a modified semiconductor package module 100d.

In this embodiment the chip 102 comprises a top side ground plane 115 and a via 116 through the chip 102. The package mold mass, i.e. the mold layer 101, is thinned to achieve the same height as the chip 102. A (continuous) top metallization layer 110 is utilized to achieve connection of chip 102 and antenna ground 204. Significant cost reduction is achieved as through mold vias 121 and mm-wave coupling element 103 are realized within one passive inlay 128. The package might contain one or multiple of these passive inlays for connection of different antennas.

In the coupling element 103 a feed line 129 is provided which is connected to the microstrip 105 by a via 130. The RF signal is coupled from the feed line 129 to the antenna feed layer 203 through the aperture 111 in the ground layers 110 and 204. The antenna feed layer 203 is connected to the antenna elements 202 by a connection network 209 comprising metal layers and vias in the antenna substrate 201. With this embodiment the ground planes are properly connected and the manufacturing process is simplified.

FIG. 6 shows a microwave antenna package 6 including a sixth embodiment of a microwave antenna apparatus 15 according to the present disclosure. The microwave antenna apparatus 14 comprises a modified antenna module 200e and the semiconductor package module 100c as shown in FIG. 4. In this embodiment solder balls 210 are provided between the coupling lines 126 and 207 to establish a reliable connection between the antenna substrate and the mold mass ground.

Further, in the antenna module 200e the antenna feed layer 203 is directly connected to the coupling line 207. The antenna ground layer 204 is provided between the antenna feed layer 203 and the antenna elements 202 and comprises holes 211 at positions directly below the antenna elements 202 to enable feeding of the antenna feed signals from the antenna feed layer 203 to the antenna elements.

According to the present disclosure an antenna module is arranged on top of the eWLB package. A system in package solution can thus be provided comprising bottom RDLs, a passive coupling block for mm-wave signal transition, through mold vias for GND connection, a GND plane with slot for mm-wave aperture coupling and electromagnetic decoupling from active dies and antennas, and an antenna module on top of eWLB package.

The antenna module may be manufactured by applying separate technology process. The antenna module can comprise a patch antenna, dielectric resonator antennas or dielectric rod antennas, spiral antennas, resonant cavity antennas, broadside or endfire antennas, waveguide antennas, loop antennas, substrate integrated antennas, etc.

The antenna module placed on the eWLB package can be a single antenna or an array of antennas, or antennas placed in MIMO configurations. The antenna module footprint is larger than the eWLB package to facilitate the increase in antenna aperture size for high gain and more directivity and small beamwidth.

The substrate used for antenna module can be FR4, organic substrate, ceramic substrate, rigid or semi-rigid substrate.

The antennas can be fed with the signal through a coupling block or/and solder balls.

The ground connections between epoxy and antenna grounds can be made using conductive epoxy with exact aperture alignment for signal coupling or aperture coupling through only antenna ground plane and connections between two ground planes can be done at selective areas through direct conductive epoxy or using the UBM layer by employing the second metal layer on top side of eWLB package.

The PoP antenna module can be left outside the epoxy mold or can also be encapsulated in the epoxy mold compound.

PoP heterogeneous (where antenna module and coupling blocks are independently fabricated and integrated and embedded in eWLB through pick and place process) RF and mm-wave antenna integration can be achieved using two-sided RDL eWLB package technology.

A number of advantages and improvements can be achieved with the various embodiments of the disclosed microwave antenna apparatus and the disclosed microwave antenna package. Beam width and gain can be better controlled, which will allow avoiding the deteriorating effects of floating ground plane. The ripple caused by the reflector and epoxy could be reduced when integrating highly radiation efficient antennas. Different types of antennas can be used. Shielding of parasitic radiation can be created by the mm-wave chip (parasitic radiation causes unwanted interference into the receive channels and deteriorates the transmit antenna radiation patterns).

Packages can be equipped with different antenna topologies within one manufacturing run. Antenna topologies might be changed in product line to target the requirements for new applications. Performance deteriorating effect of epoxy can be mitigated to some extent to already existing techniques. Complete mm-wave system integration on package level can be achieved without any need for external antennas.

PoP provides increased flexibility of designing antennas by completely avoiding the restriction of chip-to-SMT-component area ratio. This PoP concept will allow designing antennas and controlling the beam width and gain by using highly directional antennas and arrays, which were difficult to integrate in eWLB before because of limited space.

A wide variety of antennas, suitable for different applications, can be now integrated with eWLB package in a very compact form. The disclosure further enables the miniaturized 3D RF packaging concept. A number of antennas have been proposed which will enhance the performance and achieve the objective of designing antennas with desired beam width (with some limitations) for future 60 GHz and beyond radar sensors. Finally, easy ground connections can be achieved using coupling blocks, or through mold vias and second metal layer on the top side of eWLB layer.

Thus, the foregoing discussion discloses and describes merely exemplary embodiments of the present disclosure. As will be understood by those skilled in the art, the present disclosure may be embodied in other specific forms without departing from the spirit or essential characteristics thereof. Accordingly, the disclosure of the present disclosure is intended to be illustrative, but not limiting of the scope of the disclosure, as well as other claims. The disclosure, including any readily discernible variants of the teachings herein, defines, in part, the scope of the foregoing claim terminology such that no inventive subject matter is dedicated to the public.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

It follows a list of further embodiments of the disclosed subject matter:

1. Microwave antenna apparatus comprising:
   a semiconductor package module comprising a mold layer, a semiconductor element, a coupling element and a redistribution layer, and
   an antenna module mounted on top of the semiconductor package module, said antenna module comprising an antenna substrate, one or more antenna elements, an antenna feed layer and an antenna ground layer, wherein the footprint of the antenna module is larger than the footprint of the semiconductor package module.

2. Microwave antenna apparatus as defined in any preceding embodiment, wherein the semiconductor package module comprises a single redistribution layer arranged on a bottom surface of the semiconductor package module facing away from the antenna module.

3. Microwave antenna apparatus as defined in any preceding embodiment, wherein the semiconductor package module comprises two redistribution layers, a first redistribution layer being arranged on a bottom surface of the semiconductor package module facing away from the antenna module and a second redistribution layer being arranged on a top surface of the semiconductor package module facing the antenna module.

4. Microwave antenna apparatus as defined in any preceding embodiment, wherein the redistribution layer comprises at least one redistribution substrate layer and one or more metal layers arranged in and/or on the at least one redistribution substrate layer.

5. Microwave antenna apparatus as defined in any preceding embodiment, wherein the semiconductor package module comprises a ground layer arranged on a top surface of the semiconductor package module facing the antenna module.

6. Microwave antenna apparatus as defined in embodiment 5, wherein the antenna module comprises a ground layer arranged on a bottom surface of the antenna module facing the semiconductor package module.

7. Microwave antenna apparatus as defined in embodiment 5 and 6, wherein the ground layer of the antenna module and the ground layer arranged of the semiconductor package module each comprise a slot coinciding to each other.

8. Microwave antenna apparatus as defined in embodiment 5, 6 or 7, wherein the redistribution layer comprises a redistribution ground layer, which is connected to the ground layer arranged on the top surface of the semiconductor package module through one or more vias arranged within the mold layer.

9. Microwave antenna apparatus as defined in any preceding embodiment, wherein the antenna module comprises as one or more antenna elements one or more of a patch antenna, a dielectric resonator antenna, a dielectric rod antenna, a spiral antenna, a resonant cavity antenna, a broadside or endfire antenna, a waveguide antenna, a loop antenna, and a substrate integrated antenna.

10. Microwave antenna apparatus as defined in any preceding embodiment, wherein the antenna module comprises a single antenna or an array of antennas or two or more antennas in a MIMO configuration.

11. Microwave antenna apparatus as defined in any preceding embodiment, wherein the antenna substrate layer is made of a microwave material, or of a BT, FR4 or FR408 type substrate material, or of ceramics, or of Rogers substrate material, of PTFE, or of a mold type material, or of a rigid material, or of a semi-rigid material.

12. Microwave antenna apparatus as defined in any preceding embodiment, wherein the antenna module is directly mounted on top of the semiconductor package module or with solder balls in between.

13. Microwave antenna apparatus as defined in any preceding embodiment, wherein the one or more antenna elements and the antenna feed layer are coupled through one or more vias, through proximity coupling or through an insert feed line.

14. Microwave antenna apparatus as defined in embodiment 3, wherein the semiconductor package module comprises a through via feed line through the coupling element for coupling the first redistribution layer and the second redistribution layer.

15. Microwave antenna apparatus as defined in any preceding embodiment, wherein the semiconductor package module comprises a passive inlay within the coupling block.

16. Microwave antenna package comprising
a PCB arrangement comprising a PCB layer and
a microwave antenna apparatus as defined in any one of the preceding embodiments coupled to the PCB arrangement forming a fan-out wafer level package.

The invention claimed is:

1. Microwave antenna apparatus comprising:
a semiconductor package module comprising a mold layer, a semiconductor element, a coupling element and a redistribution layer, and
an antenna module mounted on top of the semiconductor package module, said antenna module comprising an antenna substrate, one or more antenna elements, an antenna feed layer and an antenna ground layer,
wherein the footprint of the antenna module is larger than the footprint of the semiconductor package module,
wherein the semiconductor package module comprises aground layer arranged on a top surface of the semiconductor package module facing the antenna module, and
wherein the antenna module comprises a ground layer arranged on a bottom surface of the antenna module facing the semiconductor package module.

2. The microwave antenna apparatus as claimed in claim 1,
wherein the semiconductor package module comprises a single redistribution layer arranged on a bottom surface of the semiconductor package module facing away from the antenna module.

3. The microwave antenna apparatus as claimed in claim 1,
wherein the semiconductor package module comprises two redistribution layers, a first redistribution layer being arranged on a bottom surface of the semiconductor package module facing away from the antenna module and a second redistribution layer being arranged on a top surface of the semiconductor package module facing the antenna module.

4. The microwave antenna apparatus as claimed in claim 1,
wherein the redistribution layer comprises at least one redistribution substrate layer and one or more metal layers arranged in and/or on the at least one redistribution substrate layer.

5. The microwave antenna apparatus as claimed in claim 1,
wherein the ground layer of the antenna module and the ground layer arranged of the semiconductor package module each comprise a slot coinciding to each other.

6. The microwave antenna apparatus as claimed in claim 1,
wherein the redistribution layer comprises a redistribution ground layer, which is connected to the ground layer arranged on the top surface of the semiconductor package module through one or more vias arranged within the mold layer.

7. The microwave antenna apparatus as claimed in claim 1,
wherein the antenna module comprises as one or more antenna elements one or more of a patch antenna, a dielectric resonator antenna, a dielectric rod antenna, a spiral antenna, a resonant cavity antenna, a broadside or endfire antenna, a waveguide antenna, a loop antenna, and a substrate integrated antenna.

8. The microwave antenna apparatus as claimed in claim 1,
wherein the antenna module comprises a single antenna or an array of antennas or two or more antennas in a MIMO configuration.

9. The microwave antenna apparatus as claimed in claim 1,
wherein the antenna substrate layer is made of a microwave material, or of a BT, FR4 or FR408 type substrate material, or of ceramics, or of Rogers substrate material, of PTFE, or of a mold type material, or of a rigid material, or of a semi-rigid material.

10. The microwave antenna apparatus as claimed in claim 1, wherein the antenna module is directly mounted on top of the semiconductor package module or with solder balls in between.

11. The microwave antenna apparatus as claimed in claim 1,
wherein the one or more antenna elements and the antenna feed layer are coupled through one or more vias, through proximity coupling or through an insert feed line.

12. The microwave antenna apparatus as claimed in claim 3,
wherein the semiconductor package module comprises a through via feed line through the coupling element for coupling the first redistribution layer and the second redistribution layer.

13. The microwave antenna apparatus as claimed in claim 1,
wherein the semiconductor package module comprises a passive inlay within g coupling block.

14. The microwave antenna package, comprising:
a PCB arrangement comprising a PCB layer and
a microwave antenna apparatus coupled to the PCB arrangement forming a fan-out wafer level package, the microwave antenna apparatus including
a semiconductor package module comprising a mold layer, a semiconductor element, a coupling element and a redistribution layer, and
an antenna module mounted on top of the semiconductor package module, said antenna module comprising an antenna substrate, one or more antenna elements, an antenna feed layer and an antenna ground layer,
wherein the footprint of the antenna module is larger than the footprint of the semiconductor package module,
wherein the semiconductor package module comprises a ground layer arranged on a top surface of the semiconductor package module facing the antenna module, and
wherein the antenna module comprises a ground layer arranged on a bottom surface of the antenna module facing the semiconductor package module.

\* \* \* \* \*